(12) United States Patent
Fulga

(10) Patent No.: US 7,893,761 B2
(45) Date of Patent: Feb. 22, 2011

(54) MONOTONIC AND VOLTAGE SUPPLY INDEPENDENT AUTOMATIC GAIN CONTROL AMPLIFIER

(75) Inventor: Stefan Fulga, Ottawa (CA)

(73) Assignee: SiGe Semiconductor (Europe) Limited, Hertfordshire (GB)

( * ) Notice: Subject to any disclaimer, the term of this patent is extended or adjusted under 35 U.S.C. 154(b) by 158 days.

(21) Appl. No.: 11/582,486

(22) Filed: Oct. 18, 2006

(65) Prior Publication Data

US 2008/0094138 A1 Apr. 24, 2008

(51) Int. Cl.
*H03G 3/10* (2006.01)

(52) U.S. Cl. .................. 330/124 R; 330/279; 330/129; 330/136

(58) Field of Classification Search .............. 330/279, 330/124 R, 129, 138
See application file for complete search history.

(56) References Cited

U.S. PATENT DOCUMENTS 5,896,064 A * 4/1999 Kaku ........................ 330/279

* cited by examiner

*Primary Examiner*—Michael B Shingleton
(74) *Attorney, Agent, or Firm*—Kilpatrick Townsend & Stockton LLP

(57) ABSTRACT

A method and circuit are provided wherein the magnitude of an RF signal provided by RF circuit is used to derive a control set point of the RF circuit via an intermediate controller circuit. This controller circuit having the specific function of providing the actual voltage applied to the control point of the RF circuit, via the use of a charge pump, regulator or combination thereof. In this manner the controller limits the maximum applicable voltage set by the limiting characteristics of the charge pump, voltage regulator, or combination thereof. Such limiting characteristics allow the control of the RF circuit to be stabilized against a variety of external factors such as ambient temperature, battery voltage, circuit aging, amongst other factors in a manner exploiting a minimum of additional electronics thereby providing for such performance enhancements with minimum additional die footprint and power consumption.

27 Claims, 13 Drawing Sheets

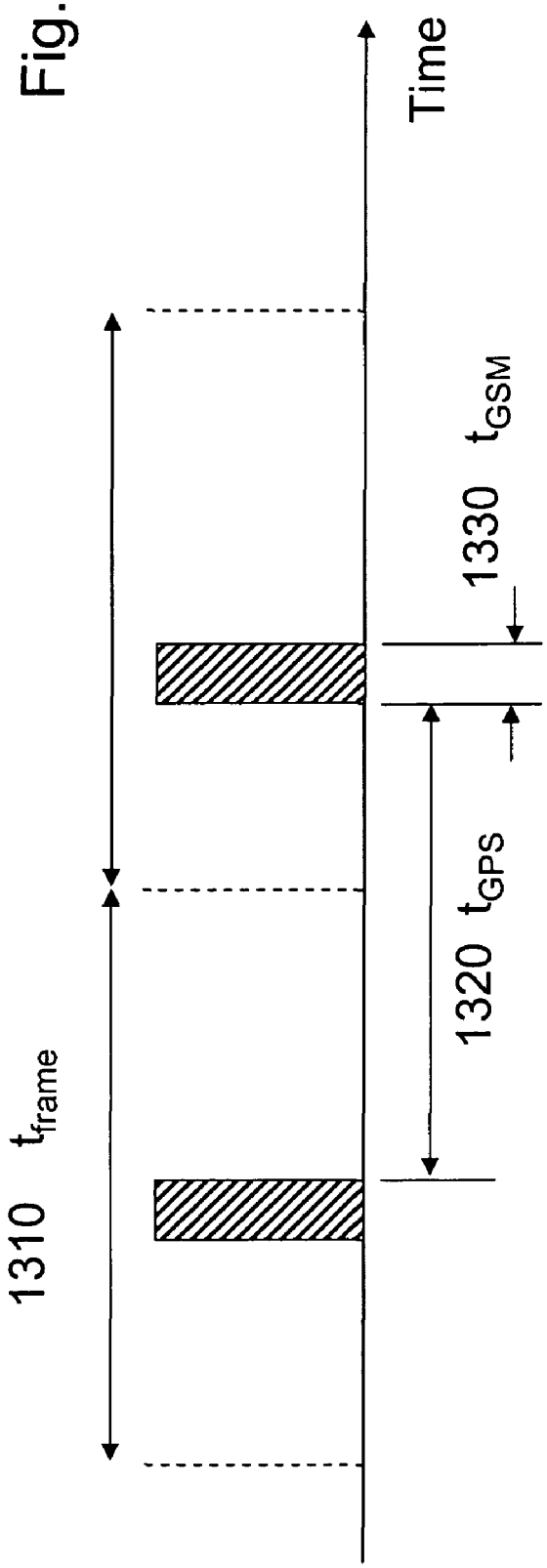

MONOTONIC AND VOLTAGE SUPPLY INDEPENDENT AUTOMATIC GAIN CONTROL AMPLIFIER

FIELD OF THE INVENTION

The invention relates to the field of electronic automatic gain controlled amplifiers and more particularly to controlling automatic gain control amplifiers to support monotonic operation thereof.

BACKGROUND

In recent years, the use of wireless and RF technology has increased dramatically in portable and hand-held units, where such units may be deployed by a variety of individuals from soldier on the battlefield to a mother searching for her daughter's friend's house. The uses of wireless technology are widespread, increasing, and include but are not limited to telephony, Internet e-mail, Internet web browsers, global positioning, photography, and in-store navigation.

Within each hand-held or portable wireless device there is a highly sensitive chain of RF electronics providing both the transmission and receiver functions. These circuits require not only direct manipulation of the RF signal, for example by amplification, attenuation, mixing or detection, but also ancillary functions such as power monitoring, signal identification, and control. Additionally these functions may be undertaken post-mixing, such that the signals are at a lower RF frequency, typically called the IF or Intermediate Frequency, than the original received signal. The later may include for example the extraction of digitally encoded voice signals from their carrier in cellular telephony, or analog signal extraction from a high frequency microwave carrier in military applications.

In all cases the device must be capable of processing signals of different strengths, which arise from a multitude of sources including but not limited to changing weather conditions, rapid movement of source/receiver relative to one another, and multiple sources of varying distances. Thus the most common approach is the addition of an automatic gain control (AGC) stage within the IF/RF circuit such that the received signal is amplified to a single fixed value at an intermediate point in the circuitry. For example, this ensures maximum resolution of an analog-to-digital (ADC) converter, provides maximum signal-to-noise ratio (SNR) throughout an analog circuit, or allows for alternative lower cost implementations with lower resolution ADCs.

The AGC typically is formed from a variable gain amplifier (VGA) element whose set-point is determined from tapping a portion of the amplified RF signal of said amplifier, detecting this and deriving a DC voltage that is proportional to the root-mean-square (RMS) signal. This DC voltage is then used to adjust the gain of the VGA, sometimes using comparisons to reference voltage levels. In this manner the AGC responds to a wide range of RF signal input amplitudes and provides a fixed amplified RF signal output.

However, variable gain amplifiers exhibit a characteristic that leads to degradation of their performance. As the VGA reaches saturation, the gain curve increase monotonically until a value of $V_{AGC}$ is encountered such that gain momentarily decreases before the gain asymptotes to a fixed value. In effect, we see a local maximum in the gain versus $V_{AGC}$ profile. Plotting the first derivative of this gain profile, we observe only positive values until the region of the local maxima wherein the first derivative is negative. This is one aspect of the non-monotonic characteristic of VGA circuits.

Therefore, while at low applied control voltages, the VGA provides increasing gain with a linear characteristic for the applied input signal, at high applied control voltages the VGA amplifiers gain curve tails-off, therefore reducing the loop gain of the AGC control system. The impact of a negative first derivative in the gain profile is to effectively confuse the control system because when decreasing gain is observed it responds by increasing $V_{AGC}$ to compensate. An amplifier where gain exclusively increases with increasing $V_{AGC}$ is said to be an amplifier with a monotonic gain profile or, alternatively, a monotonic amplifier or monotonic amplification.

In many hand-held or portable instruments there is a desire is to push the operational specification to provide a competitive edge, for example in performance or cost. In some cases the push is simply a feasible technical solution within cost and conflicting system constraints, such as for example in global positioning systems requiring the detection of extremely weak signals from satellites in orbit within an electronic circuit designed for typically higher power signals from terrestrial transmitters. Hence, the circuit design would generally set the gain of the electronics to the maximum possible to recover the weaker signals. However, the device whilst providing flexibility to application now has a performance that is sensitively determined by other factors such as ambient temperature, component tolerances, battery performance, and perhaps even whether within a docking station as opposed to undocked and hand-held. Such factors can easily "tip-the-balance" from a circuit operating at the peak of gain to one resulting in degraded performance as either the gain reduces or the electronics now distorts the incoming signal.

Therefore, it is important in designing and implementing such AGC circuits that the designer considers the limits set for the control input, voltage supply, and bias voltage signal applied to the control ports of each VGA included in the design. If nominally designed for a certain voltage, the previously described factors of ambient temperature, component tolerances and battery charge amongst other factors may impact the performance. Hence, the higher performing the device must be, the tighter the tolerances on achieving such performance, but still cost is limited or fixed.

SUMMARY OF THE INVENTION

In accordance with the invention there is provided a method for stabilizing and restricting the control voltage applied to a control point within an electrical amplifier circuit such that under all operating conditions, both internal and external, the amplifier operates at a desired gain value without degrading overall system performance as a result of non-monotonic profile which leads to a reduction in the overall AGC loop gain.

The invention in its various embodiments exploits characteristics of voltage regulators and charge pumps, which are known in the prior art for stabilizing power supplies, to dynamically provide a feedback control loop that is independent from external power supplies, temperature effects and operates with high efficiency, which is essential in wireless applications.

Considering firstly voltage regulators, they themselves operate by comparing the actual generated output voltage to an internal fixed reference voltage, internally generated, and use the difference within a negative feedback servo control loop. The result is an output voltage held approximately constant if the input voltage is varying around positively and negatively from the nominal value. However, such stabilisation is considerably improved wherein the voltage regulator is always providing a voltage regulated reduction in a supply voltage.

Charge pumps are circuits employing capacitors, as energy storage devices, to provide DC voltages with very high efficiency. Typically employing internal switching to control voltage connections of an internal capacitor, they allow for the controlled generation and supply of very highly stabilised known voltages and charges into electrical circuits. Therefore, if receiving a control signal to define their control mode they can selectively provide increased charge/voltage or fixed/reduced voltage. Therefore a charge pump within a control loop can be used to provide the feedback signal based upon a detected magnitude of the amplified signal. Now if the voltage supply provided to the charge pump is a regulated signal then the overall circuit can be rendered insensitive to power supply variations as the maximum voltage within the control loop is now limited by both the regulator and charge pump.

As such the invention employs these characteristics of charge pumps and voltage regulators, either discretely or in combination to stabilize the control signal applied to a control pin of a VGA element either discretely or in combination as part of an AGC circuit. Further the invention ensures monotonic operation of the VGA. The stabilization renders the control independent to power supply variations as well as ambient temperature effects. Hence, the invention considers the deployment of an AGC within an RF circuit wherein one or more VGA elements are employed within the AGC, and where the subsequent tapping and detection of the amplified RF signal derive a feedback control signal.

In the control loop disclosed, the RF signal is detected after amplification in a detection circuit block. The detection circuit block can be one providing digital or analog measurements of the signal and generating a feedback signal therefrom. This feedback signal is then electrically coupled to a limiting circuit block, which comprises an arrangement charge pump and voltage regulator elements, such that the resulting AGC feedback signal provided forward from the limiting circuit block is not only independent of power supply fluctuations but has a maximum value established by the charge pump. This limiting AGC feedback signal being one such that the amplification is still monotonic. The AGC feedback signal can then be employed to generate the control voltage directly or indirectly which is applied to the amplifier.

BRIEF DESCRIPTION OF THE DRAWINGS

Exemplary embodiments of the invention will now be described in conjunction with the following drawings, in which:

FIG. 12b illustrates an exemplary embodiment of the analog control block illustrated in FIG. 12a.

FIG. 13 illustrates timing schematic for a GPS receiver operating according to an embodiment of the invention.

DETAILED DESCRIPTION OF EMBODIMENTS OF THE INVENTION

Figure 1:
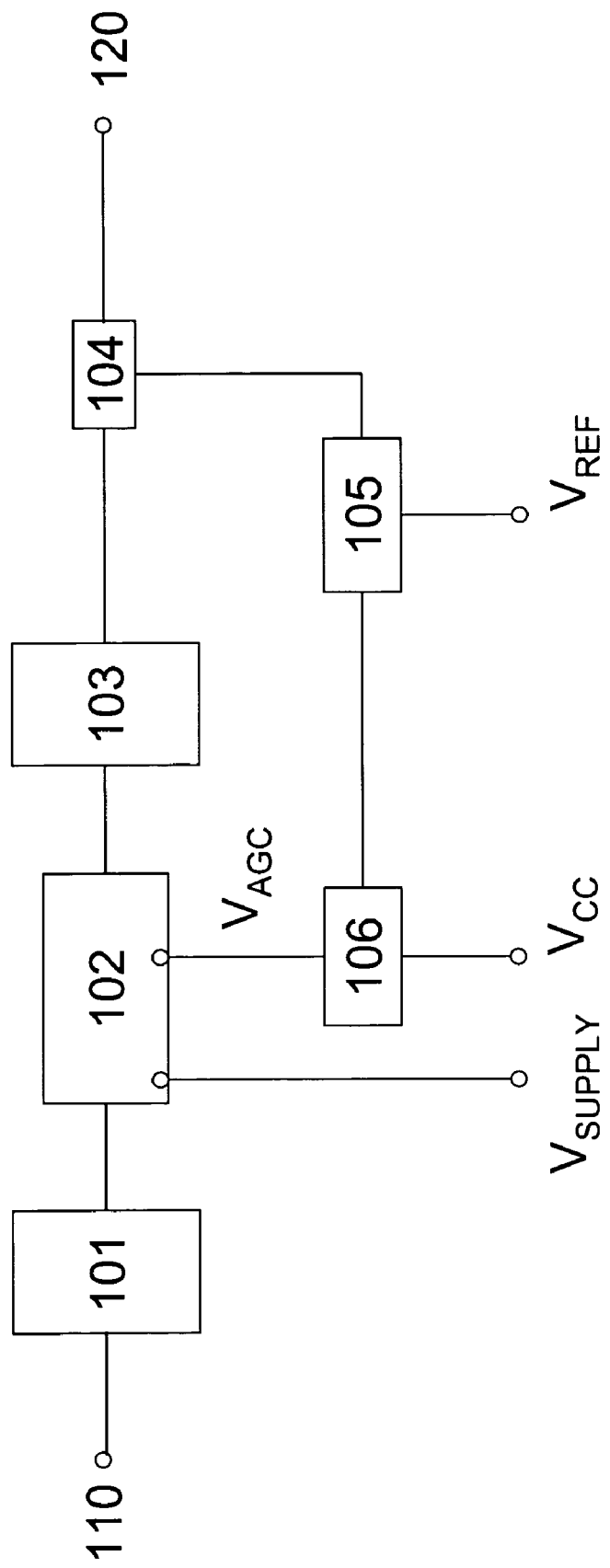
FIG. 1 illustrates a simple embodiment of the invention wherein the feedback control addresses a charge pump thereby providing required stabilization and monotonic operation.

Referring to FIG. 1 shown is a simplified block diagram illustrating a simple embodiment of the invention wherein a variable RF signal is fed from a preceding element 101 to the automatic gain control amplifier 102. The output RF signal of the automatic gain control amplifier 102 is then coupled to subsequent following RF circuitry 103 and associated coupler 104. The sampled amplified RF signal coupled at element 104 is then fed to a differential detection circuit 105, which measures the magnitude of the amplified RF signal. The differential detection circuit 105 providing a differential signal forward, the differential signal based upon detected RF signal and reference voltage $V_{REF}$, to a charge pump 106, which is powered by a voltage, supply rail Vcc. The charge pump 106 then providing appropriate control signal to the bias input voltage port of the amplifier 102.

Figure 2:
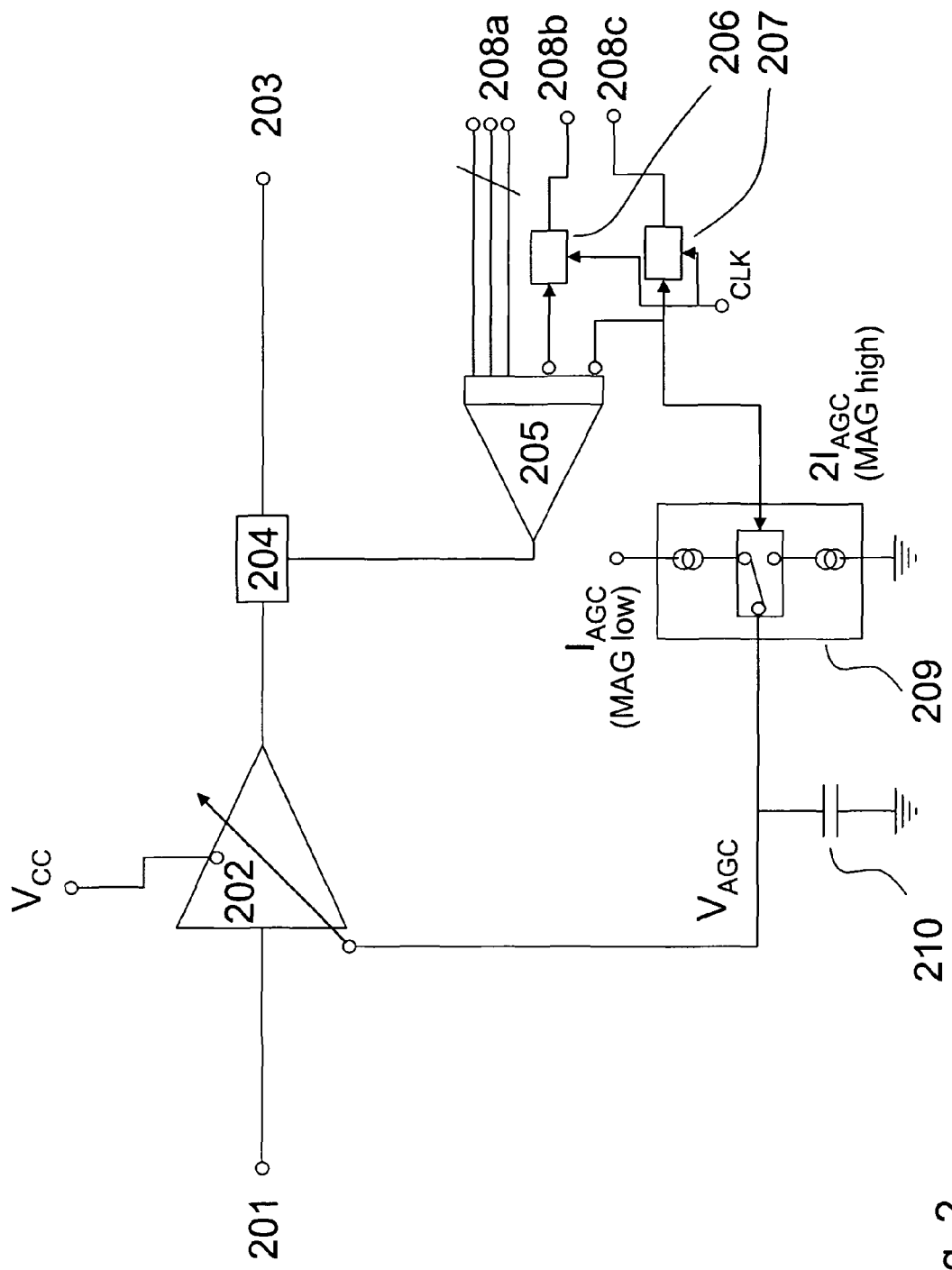
FIG. 2 illustrates an embodiment of the invention wherein the sampled RF signal is converted to the digital domain and a resulting control signal addresses the charge pump thereby providing required stabilization and monotonic operation.

Referring to FIG. 2 shown is a block diagram illustrating an overall embodiment of the invention wherein the sampled RF signal is converted to the digital domain and a resulting control signal addresses the charge pump thereby providing required stabilization and monotonic operation.

Shown is an input port 201 of a variable gain amplifier (VGA) 202 which receives a variable RF/IF signal from preceding microwave or RF circuitry. As shown the VGA 202 then provides to the output port 203 an amplified version of the RF/IF signal. Electrically disposed between the VGA 202 and the output port 203 is a tap coupler 204 which samples a portion of the amplified version of the RF/IF signal.

The sampled portion of the amplified RF/IF signal is electrically coupled to an amplified analog-to-digital converter (ADC) 205. As shown in the embodiment the ADC 205 provides a digital word 208a, which can be provided to other electronics for control or notification (such circuitry not shown for clarity). Additionally two other ADC output signals are generated; the first ADC output signal 208b being indicative of sign (SIGN) and is gated through a gate circuit 206, which is addressed with a clock (CLK) signal. The second ADC output signal 208c is the magnitude (MAG), which is again gated out via gate circuit 207. The MAG, being a digital 0 or 1, is then coupled to the charge pump circuit 209. In the embodiment shown the charge pump 209 provides a drive current ($I_{AGC}$) when MAG is LOW, digital 0, and $2\times I_{AGC}$ when MAG is HIGH, digital 1.

It would be evident to one skilled in the art that MAG and SIGN could be detected and determined separately without provision of a full digital word from an ADC or that they may be generated directly from an ADC operation wherein the analog signal is converted into the digital domain and is not propagated forward or employed in analog form at any point subsequently.

Figure 3:
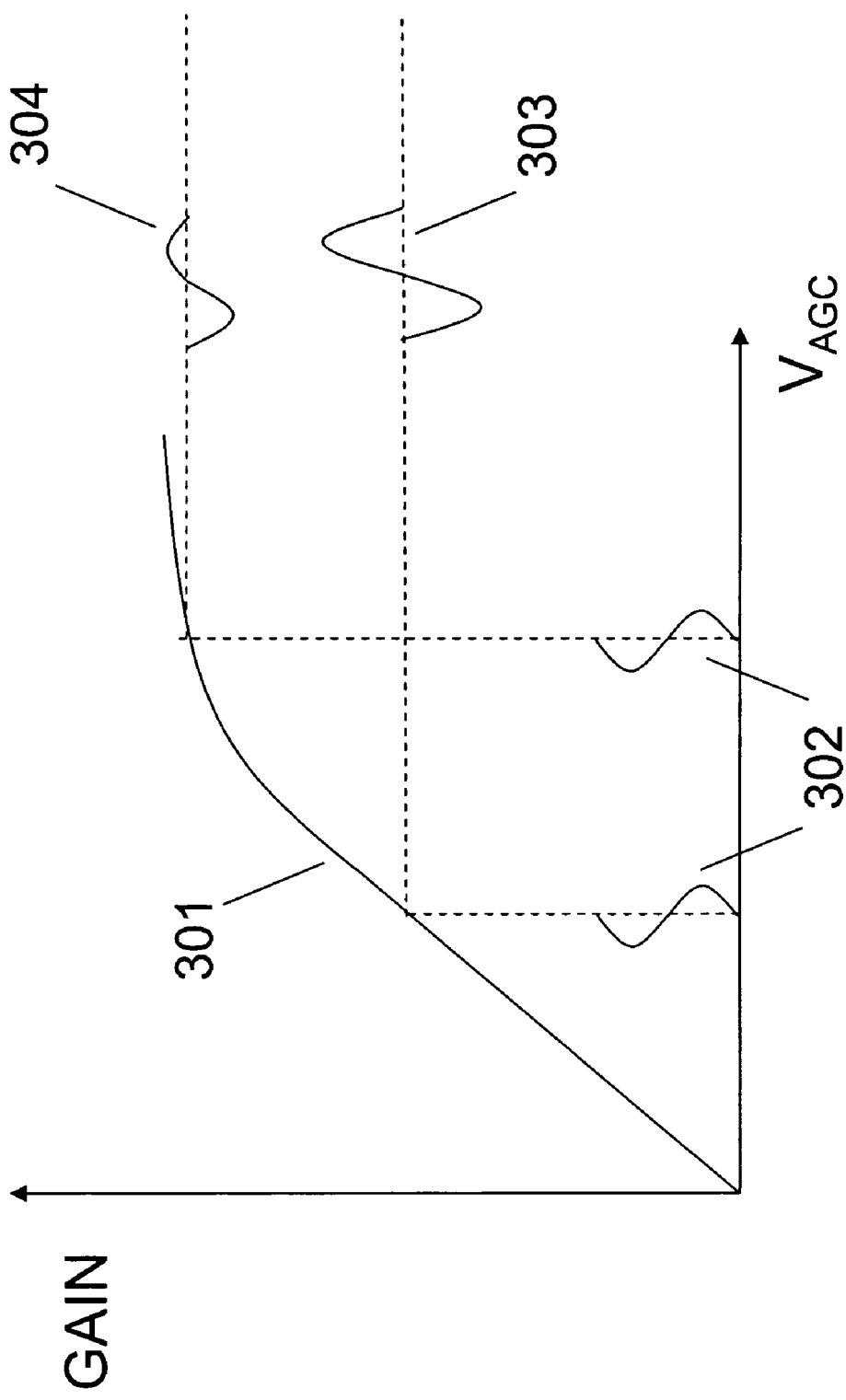
FIG. 3 illustrates the typical gain performance of an RF amplifier with the control voltage applied to the bias voltage input port of the amplifier.

Referring to FIG. 3, shown is a conventional characteristic 201 of an RF amplifier as a function of applied control input voltage ($V_{AGC}$) demonstrating the saturation of gain of an input signal 302 by said amplifier as the control input voltage increases. At low control voltages, the gain of the amplifier increases consistently and monotonically with increasing control voltage giving an output RF signal 303. In other words, the first derivative of the gain versus control voltage is relatively constant until saturation and it remains positive throughout the profile. At higher control voltages, the gain does not increase as quickly—that is, the first derivative decreases and would eventually become zero or even negative with higher control voltage. In a scenario where the first derivative has become zero or negative, an increase in $V_{AGC}$ would, in fact lead to no increase in gain or even a reduced gain. This would create control loop problems because the first response of the control loop would be to further increase the $V_{AGC}$ in order to increase gain and thereby exacerbate the undesired response. The signal, under such a scenario would become the distorted and output RF signal 304 at high input bias voltages. The invention is intended to address the control of an amplifier such that gain can be optimized, and monotonic operation ensured. It is important in a wide range of applications that the control does not result in the first derivative of the gain going to zero, or even worse negative.

Figure 4:
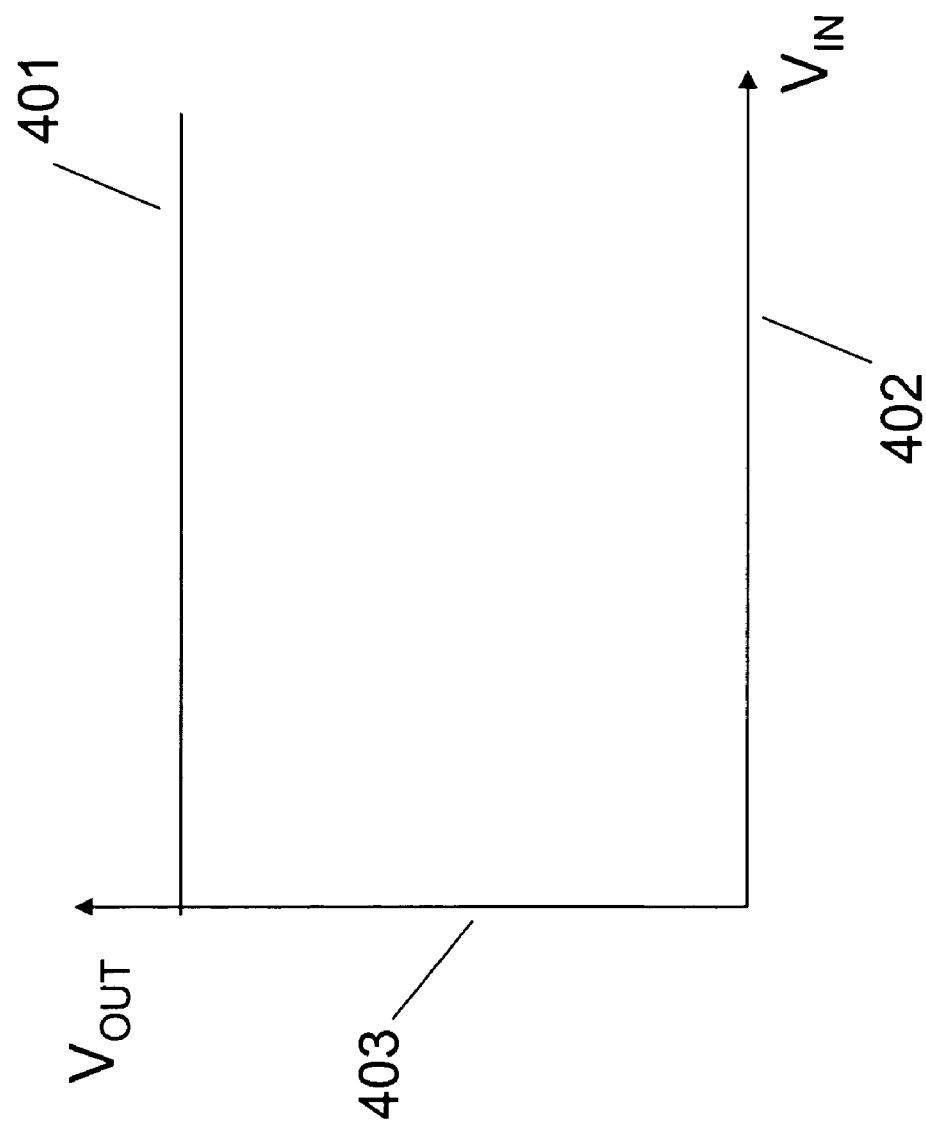
FIG. 4 illustrates the typical desired output voltage characteristics of an automatic gain control amplifier against varying RF input signal magnitude.

Referring to FIG. 4, shown is a desired output power characteristic 401 of an automatic gain control amplifier wherein the amplifier provides a constant amplified RF level 403 at its output port irrespective of the actual signal magnitude 402 of the input RF signal. This is precisely the consequence of the correct operation of the AGC control loop wherein the gain profile with $V_{AGC}$ is monotonic and the controller ensures the first derivative of gain never goes to zero, or even worse negative.

Figure 5:
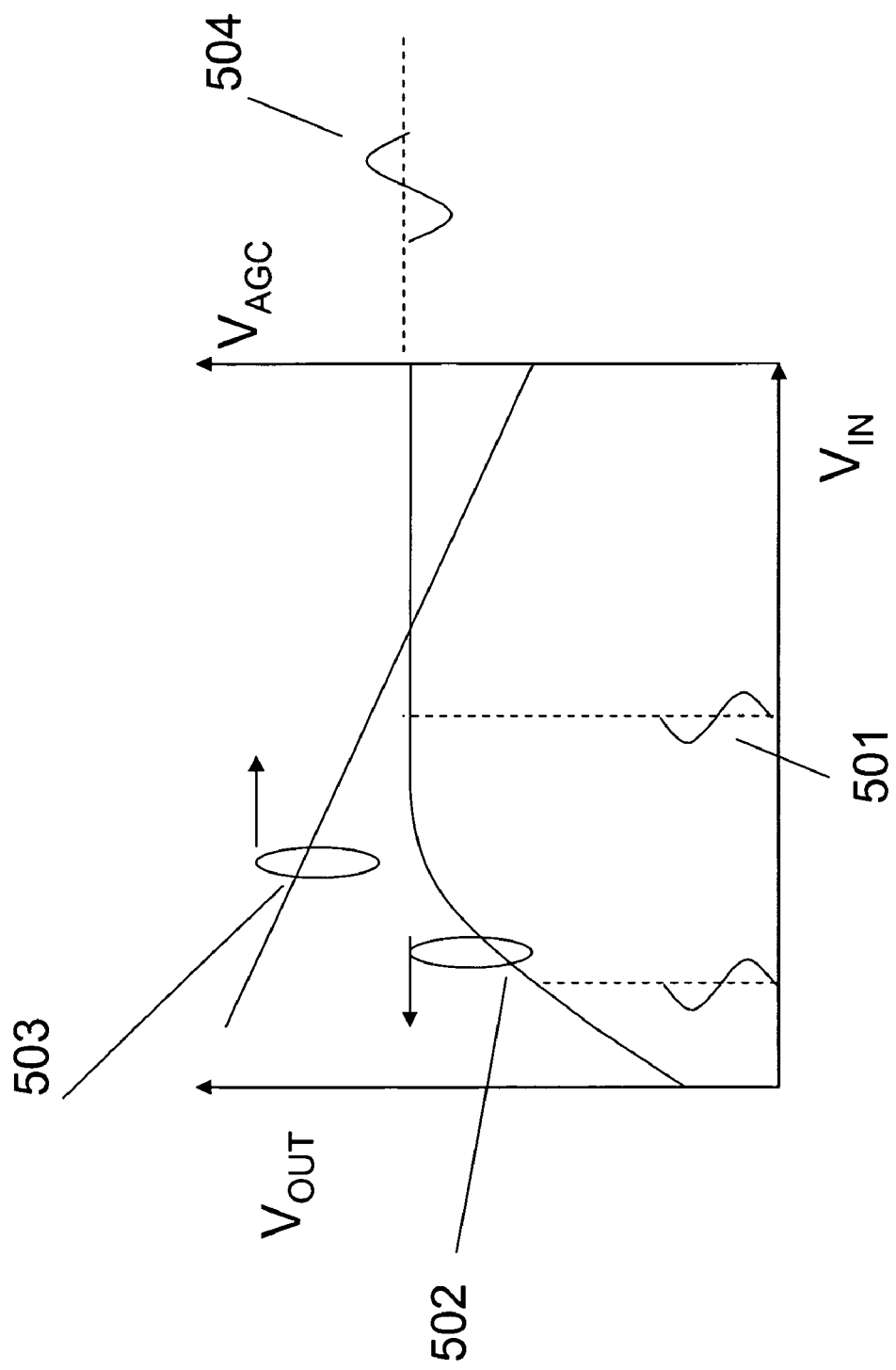
FIG. 5 illustrates the typical performance of an automatic gain control amplifier for varying input RF signal magnitude showing the undesired characteristics of non-linear performance at low input power.

Referring to FIG. 5, shown is the automatic gain control response for a typical prior art embodiment of an automatic gain control amplifier. At high RF signals 501 applied to the input port of the amplifier, the amplification required is low and hence the amplifier operates at low applied control voltage 503 to the bias voltage input port in a linear manner. As the RF signal 501 decreases, however, the automatic gain control amplifier attempts to correct and increases the control voltage 503 applied to the bias voltage port to correct for the reduced amplitude but eventually enters the gain saturation regime 502. At this point the RF signal 504 magnitude drops but also as indicated previously as shown in FIG. 3, the RF signal is distorted at the output port of the amplifier.

Figure 6:
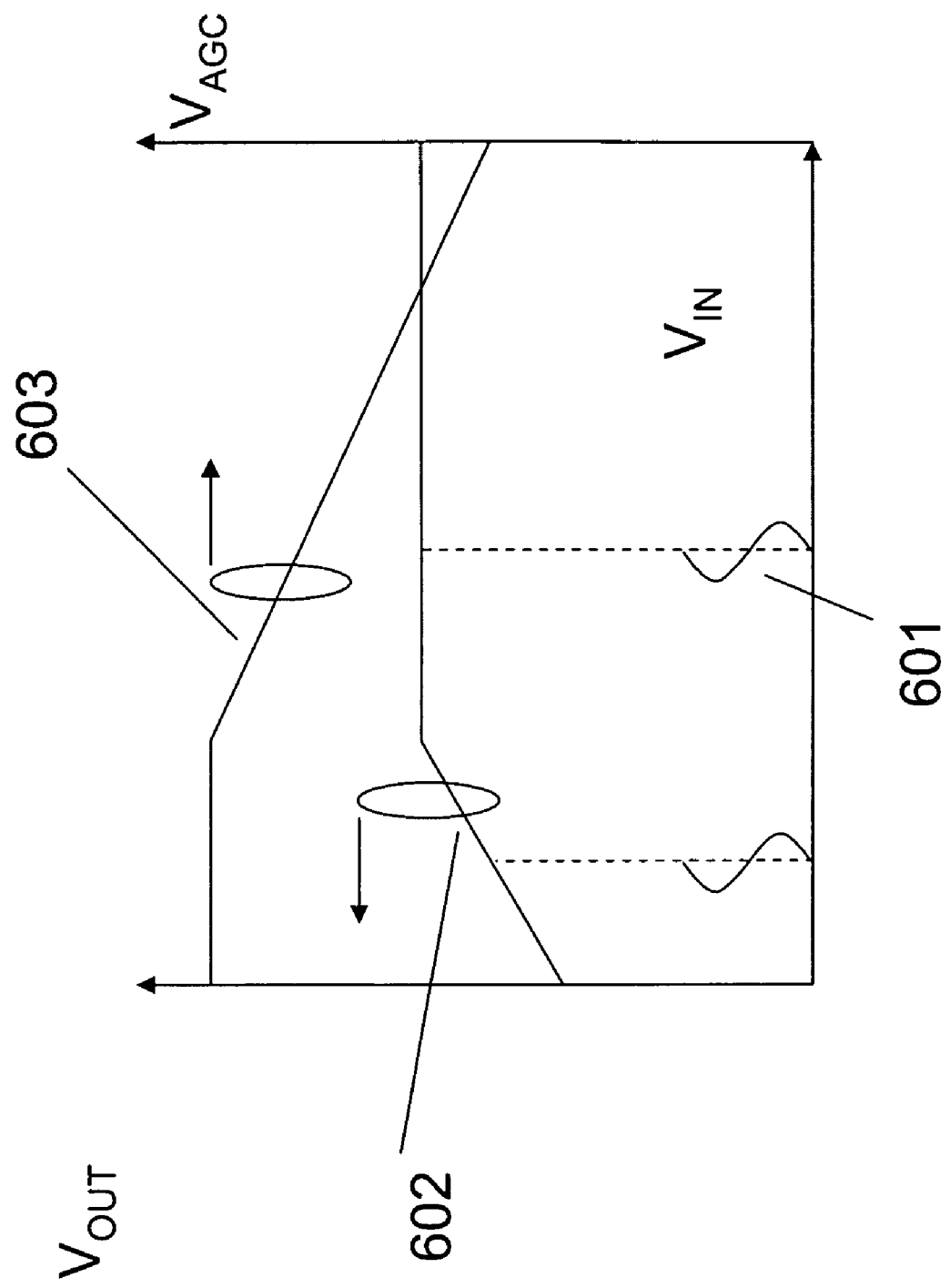
FIG. 6 illustrates the typical performance of the invention as applied to automatic gain control of an amplifier under varying RF input signals showing the enhanced characteristics of linear performance.

Referring to FIG. 6, shown is the operation of an automatic gain control amplifier operating according to an embodiment of this invention. Here again at high levels of RF input signal 601 the gain is low, and the control voltage signal 603 is similarly at a low level. In this regime, the operation of the overall automatic gain control amplifier is commonly called linear. As the RF input signal 601 level drops, the gain is increased, and the applied control voltage signal 603 increases also. In accordance with the invention, this continues until the compliance limit of the charge pump providing the control voltage signal is reached. When this occurs the control voltage signal and hence amplifier gain is constant. In this regime the amplifier provides maximum linear gain to the RF signal 601 such that the previously identified deleterious effects of reduced gain and non-linear amplification are avoided. By maintaining monotonic operation of the amplifier gain, amplifier control is facilitated since increasing or decreasing the gain only results from a single possible choice for controlling the amplifier. As such, a control loop is unlikely to be compromised by a local minimum or maximum. This substantially facilitates control loop design and increases the reliability of the control loop.

Figure 7:
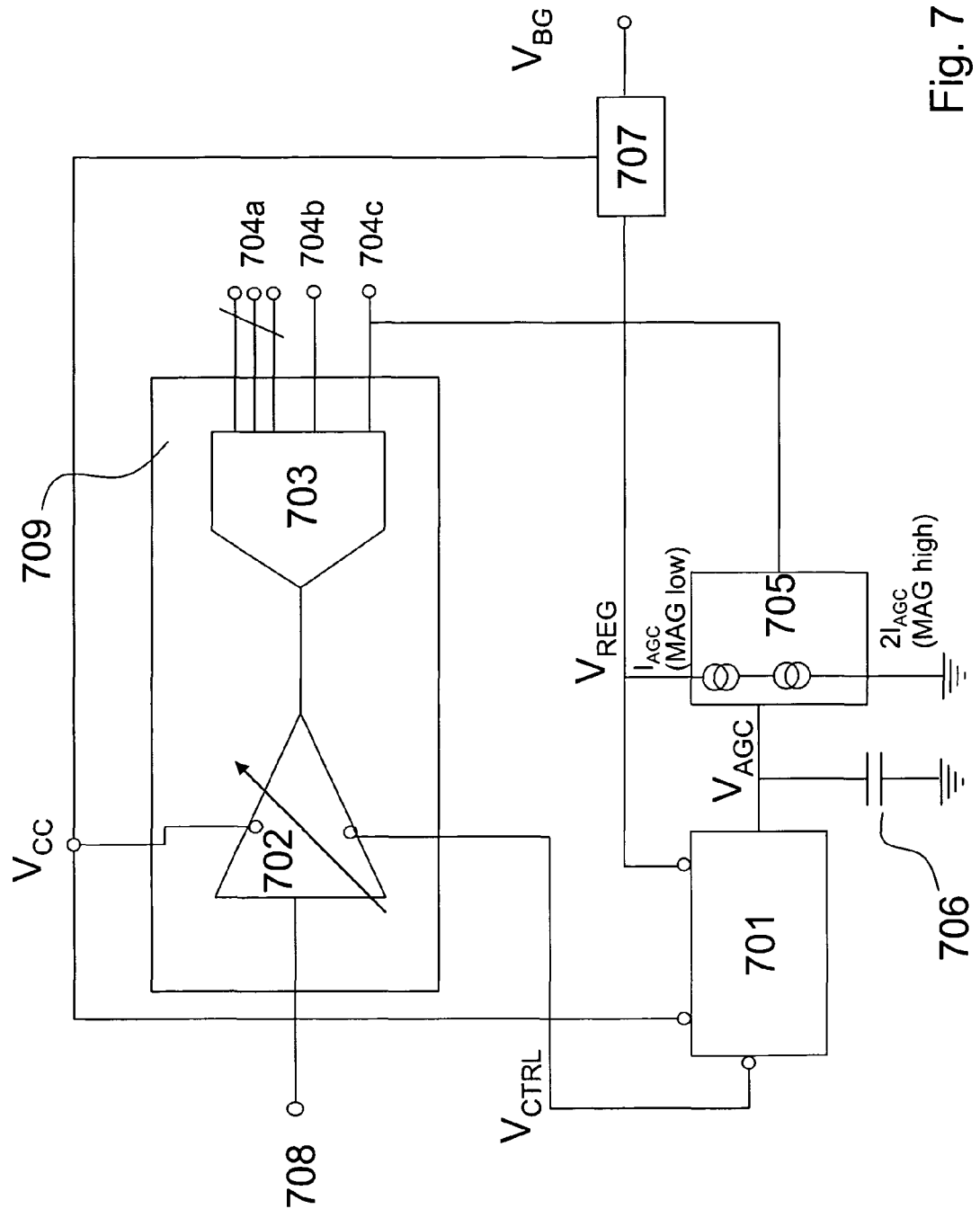
FIG. 7 illustrates a further embodiment of the invention wherein the charge pump limiting the voltage applied to the bias voltage input port is further sub-regulated by the use of voltage regulators.

Referring to FIG. 7, shown is a block diagram of a different embodiment of the invention wherein a variable RF signal propagates from a preceding element (not shown) is electrically coupled to the input port 708 of an amplified analog-to-digital converter (AmpADC) 709. The input port 708 is electrically coupled to the VGA 702 and thereafter the analog-to-digital converter (ADC) 703. Also electrically coupled to the AmpADC 709 are a power supply $V_{CC}$ and control voltage VCTRL. Output signals from the AmpADC are a digital word 704a, a sign bit 704b, and a magnitude bit 704c (MAG).

The MAG bit 704c is also electrically coupled to the charge pump 705. The charge pump 705 being electrically coupled to the output port of voltage regulator 707, which provides a regulated voltage $V_{REG}$ derived from the $V_{BG}$ applied to it. The output signal of the charge pump 705 being the voltage $V_{AGC}$ that is coupled to VGA control circuit 701. Also electrically coupled to the VGA control block 701 are the regulated voltage $V_{REG}$ and power supply rail $V_{CC}$. The VGA control block defining the signals applied to the VGA 702 being represented by the control signal $V_{CTRL}$.

By way of example for today's typical low voltage wireless devices VCC is a nominal 3.3V. However, in the embodiment of the invention outlined the VREG is established to be 2.2V over the range 2.6V≦VCC≦3.6V providing for significant variations in the performance of the wireless devices power supply management circuits and battery over manufacturing and discharge of the battery. Hence $V_{REG} \neq V_{CC}$, meaning independent thereof. The control voltage is therefore defined as $V_{CTRL} \approx V_{AGC}$ in operation, which from relationships of other circuit elements equates to $V_{AGC} \approx V_{REG}$, and therefore $V_{CTRL} \neq V_{CC}$. Hence the control signal is independent of the power supply voltage fluctuations.

Additionally, as evident to one skilled in the art, the derivation $V_{REG}$ from $V_{BG}$, which is a voltage generated by a band gap circuit, enables the maintenance of the same control profile irrespective of changes in the ambient temperature.

Figure 8:
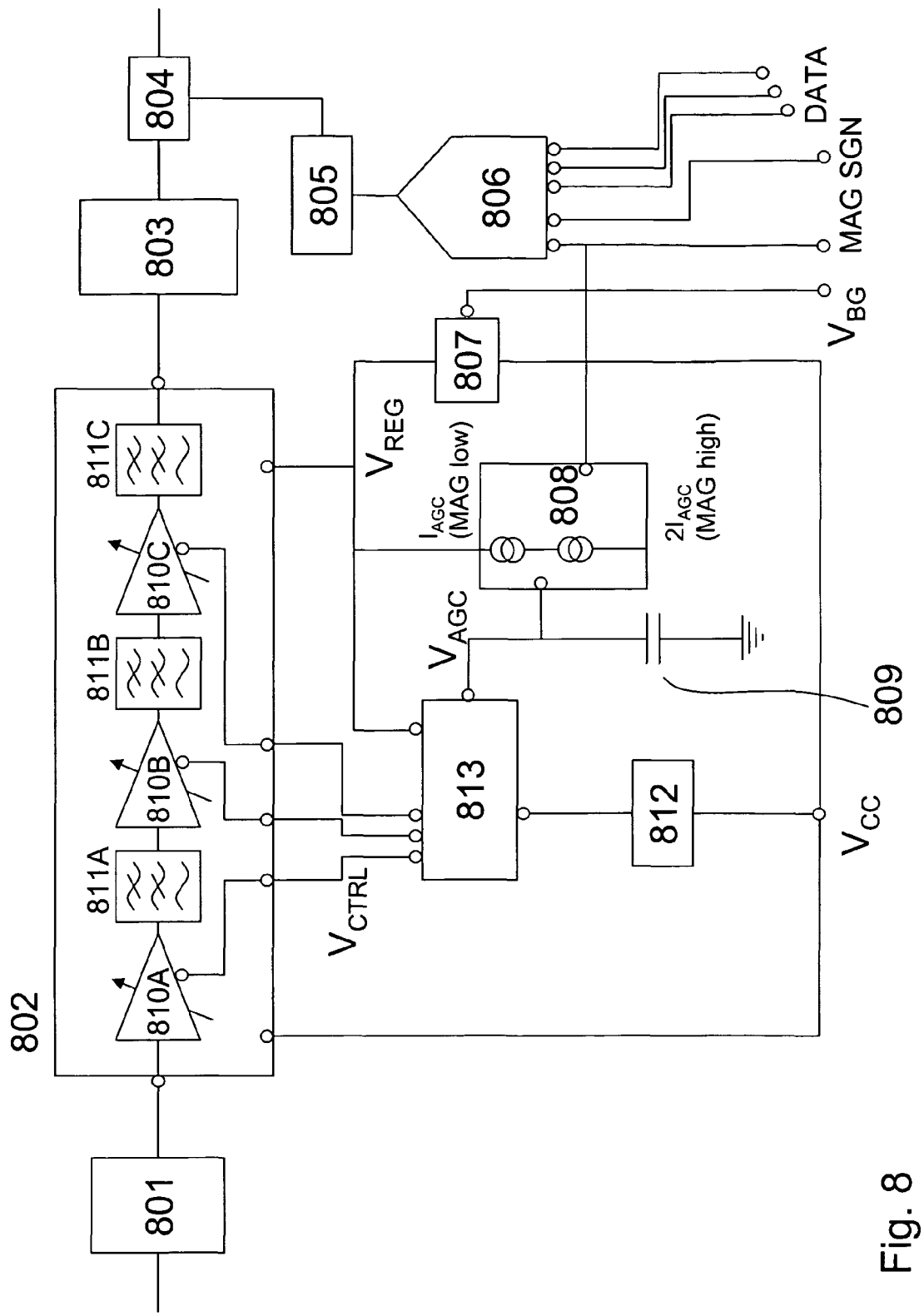
FIG. 8 illustrates a further typical embodiment of the invention wherein the amplifier is constructed from a series of discrete amplifier elements in conjunction with electrical filters.

Referring to FIG. 8, shown is a block diagram of a further embodiment of the invention wherein the control signal voltage $V_{CTRL}$, coupled to the control port of the automatic gain control amplifier 802 results in gain adjustment of multiple variable gain amplifier elements, 810A, 810B, and 810C. Herein, an RF signal is coupled from preceding RF circuitry 801 to the input port of the automatic gain control amplifier

802. Wherein said automatic gain control amplifier 802 is constructed from a serial arrangement of variable gain amplifier blocks, 810A, 810B, and 810C which are combined together with filter elements, 811A, 811B, and 811C. The output RF signal of the automatic gain control amplifier 802 propagates forward to the following RF circuitry 803 and then a monitoring element 804, which couples a portion of the RF signal and propagates this portion to a detector 805. The detected analog signal is then electrically coupled to an analog-to-digital converter 806, which provides output signals in respect of DATA, SGN and MAG. The MAG output signal also being coupled to charge pump 808.

The charge pump 808 has electrically coupled to power rail $V_{REG}$, which is a regulated voltage provided from voltage regulator 807 and derived from the general power rail $V_{CC}$. The charge pump then providing a voltage signal VAGC to the amplifier control block 813.

The amplifier control block 813 also being electrically coupled to a regulated power supply via voltage regulator 812 and the regulated power supply $V_{REG}$ provided from voltage regulator 807 which is also connected to a control port $V_{BG}$.

The amplifier control block 813 therein generates the control signal voltage VCTRL to the automatic gain control amplifier 802. As discussed supra, the result is that the control signal voltage becomes independent of the power supply voltage fluctuations, and the further dependency of $V_{REG}$ from $V_{BG}$, which is a voltage generated by a band gap circuit. Removing the impact of a changing power supply voltage and regulator voltage, the maintenance of the same control profile irrespective of changes in the ambient temperature is achieved.

Figure 9:
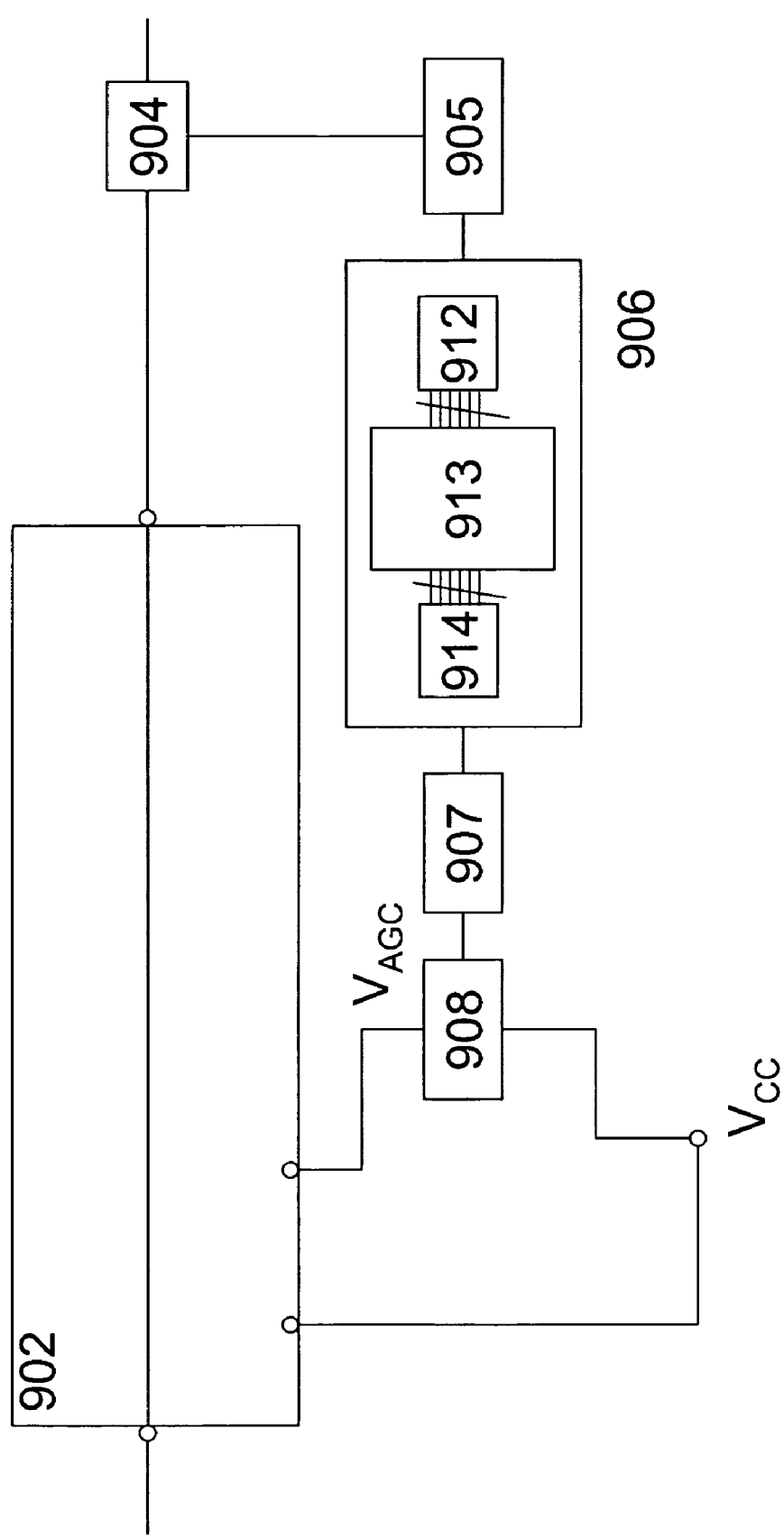
FIG. 9 illustrates a further embodiment of the invention wherein the feedback control loop incorporates a digital decision section.

Referring to FIG. 9, shown is a block diagram of a further embodiment of the invention wherein the control block 906 includes digital circuit elements. As with previous exemplary embodiments, the automatic gain control amplifier 902 has coupled to an output port, directly or after subsequent RF circuit elements a monitoring element 904. Said monitoring element 904 couples a portion of the propagating RF signal to an RF detector 905 which measures the magnitude of the RF signal. Said RF detector 905 therefore provides a voltage signal to the control block 912 which comprises an analog-to-digital converter 912, digital processor element 913 and digital-to-analog converter 914. The digital processor element 913 determining the appropriate magnitude of the bias voltage control signal of the automatic gain control amplifier 902. Said digital representation of appropriate setting being converted to an analog voltage signal by the digital-to-analog converter 914 and coupled via a voltage regulator 907 to the charge pump 908. The output port of the charge pump 908 therein connected to the bias voltage control signal port of the automatic gain control amplifier 902.

Figure 10:
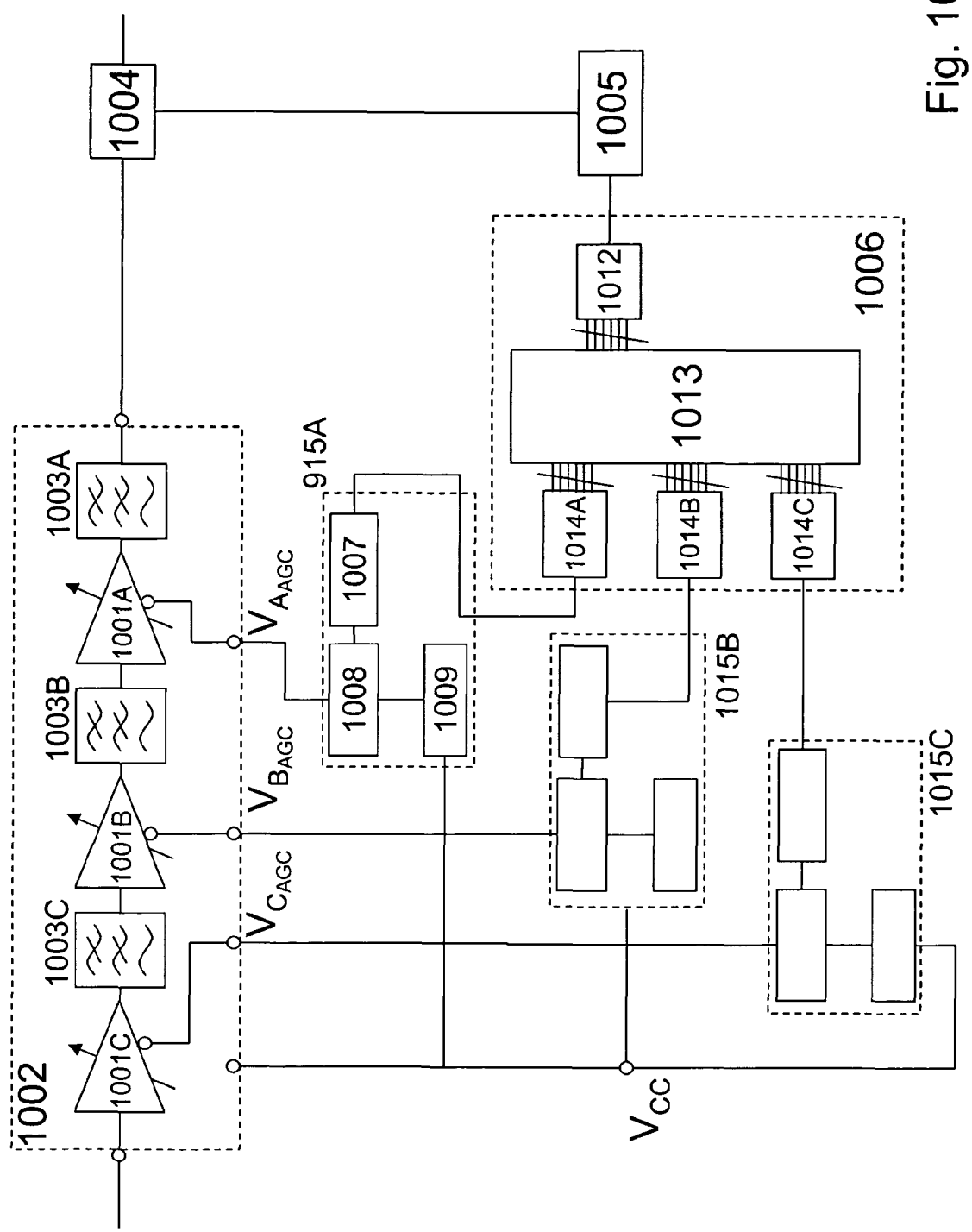
FIG. 10 illustrates a further embodiment of the invention wherein the feedback digital control circuit applies a separate control signal to each individual variable gain amplifier element of the automatic gain control amplifier.

Additionally, it is possible to consider a further embodiment wherein the gain of each individual variable gain amplifier within the automatic gain controller is adjusted discretely and independently. Such an embodiment is shown in FIG. 10. Herein the automatic gain control amplifier 902 comprises a series of variable gain amplifier blocks, 1001A, 1001B, and 1001C, which are combined together with filter elements, 1003A, 1003B, and 1003C. Optionally, the filter elements are excluded. Each variable gain amplifier element, 1001A, 1001B, and 1001C, is set by an independent bias voltage control signal applied to the appropriate bias voltage control port of the automatic gain control amplifier, 1002, herein identified by the signal descriptors $V_{A_{AGC}}$, $V_{B_{AGC}}$, and $V_{C_{AGC}}$. Said bias voltage control signals being determined from a feedback control loop which comprises an RF coupler 1004 which directs a portion of the output RF signal from the automatic gain control amplifier 1002 to an RF detector 1005 which provides an output voltage signal determined by the magnitude of the RF signal. This is then analyzed by a control circuit 1006, which first digitizes the voltage signal with a digital-to-analog converter 1012 and determines the appropriate action with a control decision element 1013.

The control decision element 1013 therein provides digital control signals to an array of digital-to-analog converters (DAC) 1014A, 1014B, and 1014C. Each DAC is coupled to a bias control regulating circuit 1015A, 1015B, and 1015C providing a control bias voltage signal to a stage of the automatic gain control amplifier 1002. Within each bias control regulating circuit, the analog control voltage from the corresponding DAC is coupled to a first voltage regulator 1007, which regulates the voltage and stabilizes it prior to feeding the charge pump 1008. The charge pump is itself connected to the bias voltage power rail by a second voltage regulator 1009.

Figure 11:
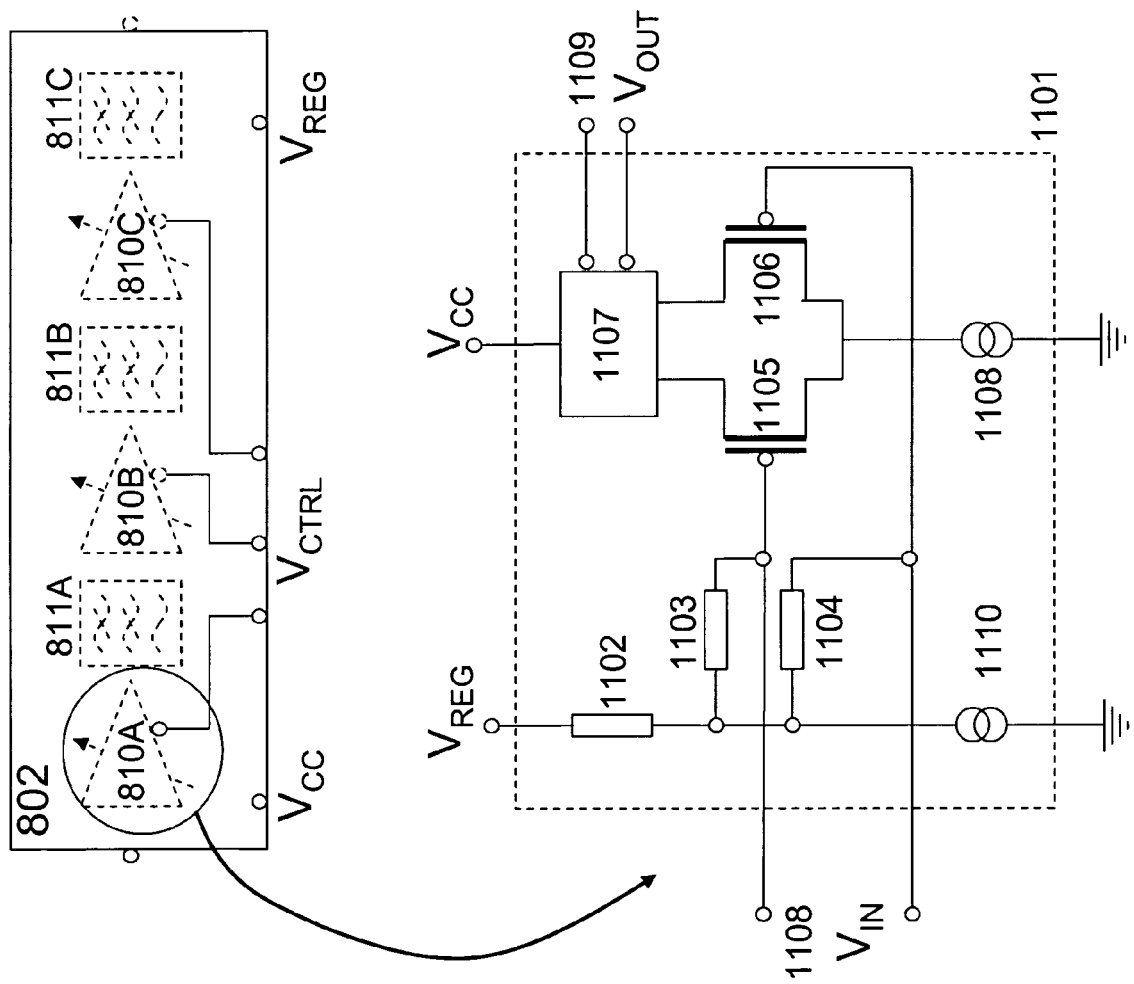
FIG. 11 illustrates another embodiment of an amplifier gain cell wherein the bias signal applied to the amplifier input port is also independent of power supply voltage and temperature.

Referring to FIG. 11 shown is an embodiment of an amplifier gain cell wherein the bias voltage at the amplifier bias control input port is also independent of power supply voltage and temperature. Shown is the multi-stage amplifier as outlined in FIG. 8 wherein the first gain stage 810A is shown in expanded form. The variable RF signal is applied to the input port 1108, which is electrically coupled to a bipolar or CMOS transistor pair 1105 and 1106 (CMOS shown in FIG. 11). The pair of transistors is also electrically coupled to an input port 1108 and via a biasing network 1107 to the power supply voltage $V_{CC}$. The biasing network 1107 then electrically couples to the output port 1109.

The bias point of the input port 1108 is established by the connection of $V_{REG}$ to the signal lines via biasing resistors 1102 to 1104. In this manner, the bias point of the bias control input ports is also rendered relatively insensitive to variations of the power supply $V_{CC}$ and temperature.

Figure 12A:
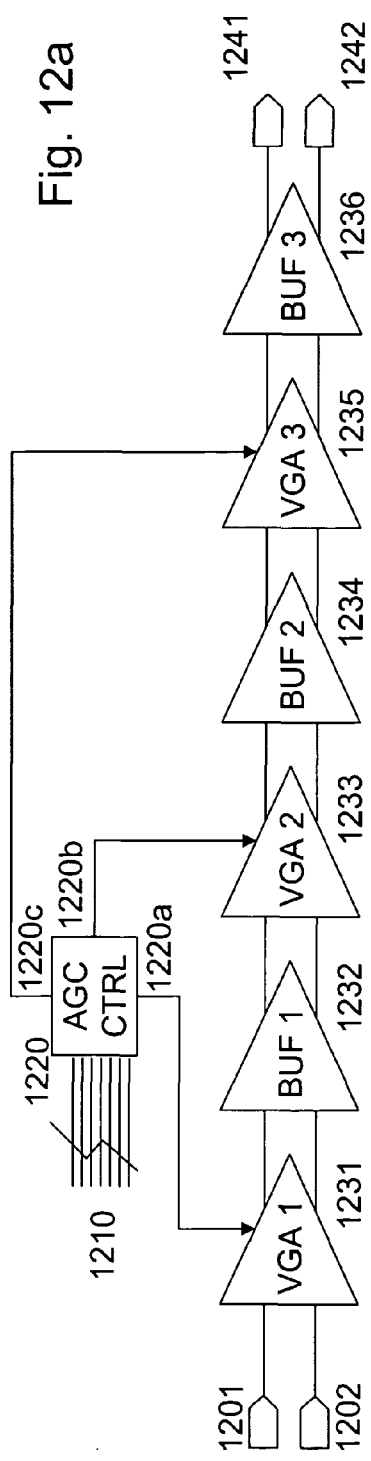
FIG. 12a illustrates a further embodiment of the invention where an analog control block provides a positive monotonic gain profile for the automatic gain controlled amplifier comprising multiple stages of variable gain.

FIG. 12a illustrates a further embodiment of the invention where an analog control block provides a positive monotonic gain profile for the automatic gain controlled (AGC) amplifier comprising multiple stages of variable gain. In the example, the AGC amplifier is intended to provide amplification of a global positioning satellite signal (GPS) within a GPS receiver. Shown is an amplifier cascade comprising three sequential variable gain stages 1231, 1233, and 1235, which are each individually, followed by one of the buffer stages 1232, 1234 and 1236. The amplifier is shown with complementary input ports 1201 and 1202 and complementary output ports 1241 and 1242.

Also shown is an analog control block 1220 which has a plurality of inputs 1210 which include control signals in addition to the necessary power supply rails. Each stage of the amplifier cascade has a control signal to each of the variable amplifier stages, control port 1220a being coupled to variable amplifier 1231, control port 1220b coupled to variable amplifier 1233, and control port 1220c to variable amplifier 1235.

Figure 12B:
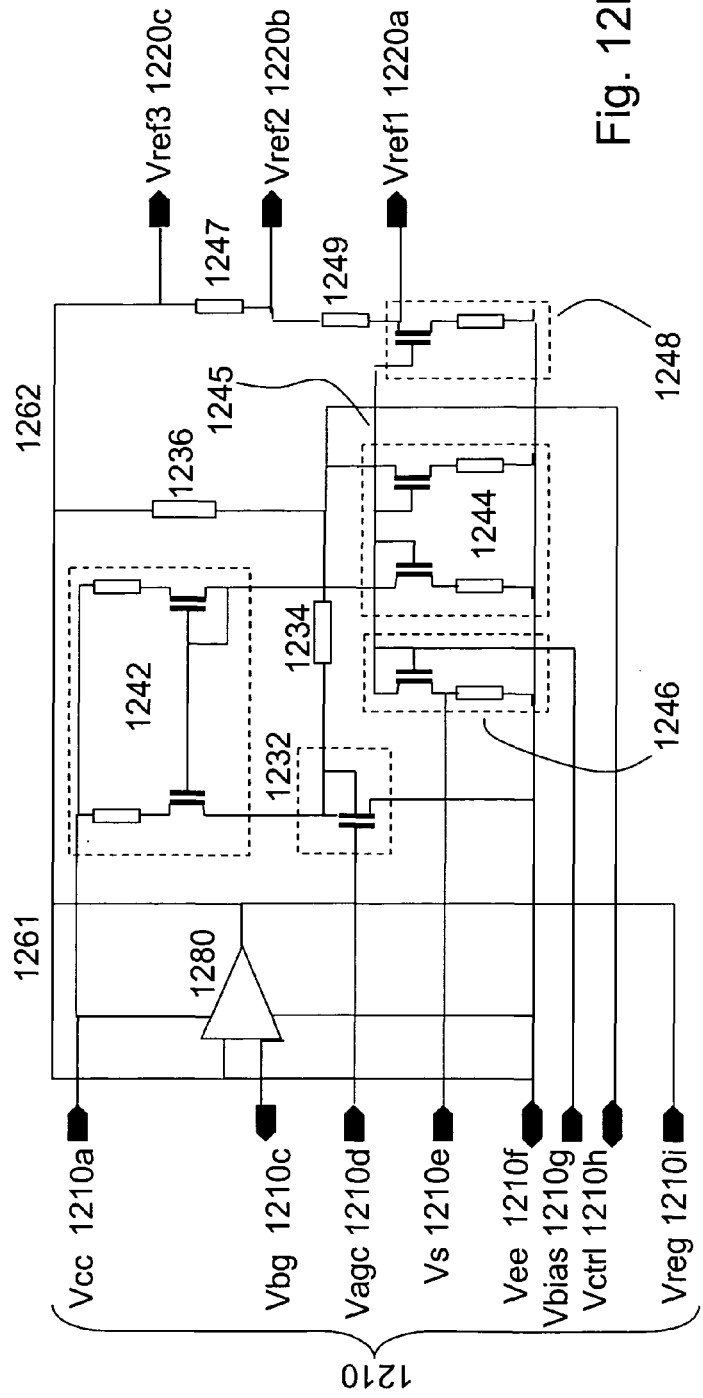

FIG. 12b illustrates a simplified exemplary embodiment of the analog control block 1220 illustrated in FIG. 12a. Shown are the plurality of inputs 1210 being upper power rail Vcc 1210a, lower power rail Vee 1210f, bandgap voltage Vbg 1210c, automatic gain control $V_{AGC}$ 1210d, offset voltage Vs 1210e, bias voltage Vbias 1210g, and control voltage Vctrl 1210h, and regulator voltage Vreg 1210i.

The bandgap voltage Vbg 1210c is boosted by the operational amplifier 1280 and provides appropriate correction of the circuitry for ambient temperature variations. This regulated voltage being provided also at port 1210i as Vreg. The input control voltage Vagc 1210d is buffered by a source follower PMOS transistor 1232 to minimize leakage of the circuit during a period when the AGC is "disabled", such as during a conflicting signal transmission that blocks the GPS signal. The output of the source follower PMOS transistor 1232 is then attenuated using a voltage divider, formed from resistors 1234 and 1236, which generates the control signal Vctrl 1210$h$.

The range of the output control voltage is limited to the compliance of the charge pump circuits 1242 and 1244 which make the whole circuit independent of the supply voltages Vcc 1210$a$ and Vee 1210$f$. The gain profiles of the multiple variable gain stages, e.g. 1231, 1233, and 1235 of FIG. 12$a$, are staggered by using a different reference voltage for each stage. The reference voltages being Vref1 1220$a$, Vref2 1220$b$, and Vref3 1220$c$. These are generated using offset voltage Vs 1210$e$, Vbias 1210$g$, in conjunction with transistor circuits 1246 and 1248 together with the resistors 1247 and 1249. The staggered reference voltages are established such that when the first stage 1231 has reached maximum gain, the next stage 1233 is starting to ramp up, as dictated by the reference voltage offset relative to the common control voltage. This allows the overall AGC profile to be established without any discontinuity, as the VGA stages 1231, 1233, and 1235 are staggered in gain profiles.

FIG. 13 illustrates a timing schematic for a GPS receiver using an embodiment of the amplifier automatic gain control outlined in FIG. 12$a$ and 12$b$, an exemplary embodiment of the invention. Here, the GPS receiver is considered operating within an environment of GSM cellular transmission bursts. As such, the GSM traffic is represented by a burst of data, which lasts for a period $t_{GSM}$ 1330, namely ⅛ of 4.6 ms, based upon a repeating frame defined by $t_{frame}$ 1310 of 4.6 ms. As such, the GPS receiver therefore has a period $t_{GPS}$ 1320 which is equal to ($t_{frame}$-$t_{GPS}$), namely ⅞ of 4.6 ms to operate and acquire the GPS signal(s). During the GSM transmission, the GPS receiver would be expected to hold constant all operational settings such that upon cessation of the GSM signal it re-establishes operation with an initial guess, which given the limited data burst $t_{GSM}$ 1330 of 0.575 ms, should be close to the optimum setting, thereby allowing the acquisition time to be greatly reduced in the next $t_{GPS}$ 1320.

Though the above embodiments are described with reference to a bias control voltage, it is known to those of skill in the art of amplifier design that other control signals are also useful in achieving the disclosed control over amplification. As such, though the above embodiments relate to bias control voltage, they are equally well suited to be implemented for varying other control signals to bring about similar advantages or results. As such, a bias control voltage is an exemplary control voltage signal.

Though some of the above embodiments are described with reference to digital control to generate a bias control voltage, in alternative embodiments the control signal is controlled with an analog circuit. Further alternatively, the analog circuit performs the functions for determining the digital control signal and for generating same.

Numerous other embodiments may be envisaged without departing from the spirit or scope of the invention.

What is claimed is:

1. A method for providing amplification of an RF signal comprising:
   providing an RF input signal;
   amplifying with an amplifier the RF input signal to provide an RF output signal;
   measuring an amplitude of the RF output signal to provide an amplitude measurement for determining an applied control voltage for controlling a gain of the amplifier; and,
   adjusting a control signal provided to a variable gain amplifier (VGA) in the amplifier in response to the applied control voltage and one of said amplitude measurement and a supply voltage applied to the amplifier, the VGA for performing the amplifying within the amplifier, the adjusting of the control signal comprising regulating a voltage of the control signal such that over a finite normal operating range of the gain for the amplifier during use, the first derivative of the gain of the amplifier as a function of the applied control voltage is positive and the gain of the amplifier is constrained between a value at a first endpoint of the range and a value at a second other endpoint of the range.

2. An amplifier according to claim 1 wherein amplifier maintains a gain absent a point having the first differential of gain being zero.

3. A method according to claim 1 wherein the control signal comprises a bias control voltage signal.

4. A method according to claim 1 wherein regulating the voltage of the control signal is performed by a circuit comprising a charge pump.

5. A method according to claim 1 wherein regulating the voltage of the control signal is performed by a circuit comprising a voltage regulator.

6. A method according to claim 1 wherein adjusting the control signal is performed by a circuit comprising both a charge pump and a voltage regulator disposed in series between the amplifier and the supply voltage.

7. A method according to claim 1 such that a monotonic gain profile of the amplification of the RF signal is substantially independent of at least one of temperature within a range of operating temperatures of the amplifier, circuit age so long as the circuit is operational, and degradation of a battery supply voltage so long as sufficient battery supply voltage remains to power the amplifier.

8. A circuit comprising:
   an input port for receiving a variable RF signal for amplification;
   an output port for providing an amplified version of the variable RF signal therefrom;
   a detector for detecting an amplitude of the amplified variable RF signal and for providing a control voltage signal therefrom to the input port of a feedback circuit, the feedback circuit comprising a regulator for regulating a control signal generated with use of the control voltage signal; and
   an amplifier circuit disposed electrically between the input port and the output port for providing gain to the variable RF signal, the amplifier including a control voltage input port for receiving the control voltage signal and a voltage supply port for receiving a supply voltage signal, the amplifier comprising:
   a variable gain amplifier (VGA) for receiving the control signal, the VGA for providing the gain to the variable RF signal,
   wherein the regulator is for regulating the control signal such that over a finite normal operating range of the gain for the amplifier during use, the first derivative of the gain of the amplifier as a function of the control voltage signal is positive and the gain of the amplifier is constrained between a value at a first endpoint of the range and a second other endpoint of the range.

9. A circuit according to claim 8 wherein the control voltage signal comprises a bias control voltage of the amplifier.

10. A circuit according to claim 8 wherein the regulator providing voltage regulation of the control voltage signal comprises a charge pump.

11. A circuit according to claim 8 wherein the supply voltage signal is regulated by a supply regulator which comprises a charge pump.

12. A circuit according to claim 8 wherein the regulator providing voltage regulation of the control signal comprises a voltage regulator.

13. A circuit according to claim 8 wherein the supply voltage signal is regulated by a supply regulator which comprises a voltage regulator.

14. A circuit according to claim 8 wherein the feedback circuit is configured such that the maximum value of the control voltage signal is approximately that voltage for which the gain of the amplifier is a maximum.

15. A circuit according to claim 8 wherein the feedback circuit is configured such that the maximum value of the control voltage signal is approximately that for which the first derivative of the gain of the amplifier as a function of the control voltage signal is positive, constrained, and asymptotically zero.

16. A circuit according to claim 8 wherein the amplifier provides an approximately maximum amplification of the variable RF signal while maintaining operation of the amplifier between a first gain value and a second other gain value, the first gain value and the second other gain value defining the range of operation of the amplifier.

17. A circuit according to claim 8 wherein the amplifier is an automatic gain control amplifier.

18. A circuit according to claim 8 wherein the amplifier comprises a plurality of amplifiers disposed in series one with another, the plurality of amplifiers having an electrical filter disposed there between.

19. A circuit according to claim 8 wherein the amplifier comprises a plurality of amplifier gain stages disposed in parallel, a switching circuit for selecting an amplifier gain stage from the plurality of amplifier gain stages for amplifying of the variable RF signal, and wherein the charge pump regulates the control voltage signal applied to the selected amplifier gain stage.

20. A circuit according to claim 8 wherein the detector comprises an analog-to-digital converter.

21. A circuit according to claim 8 such that a monotonic gain profile of the amplification of the variable RF signal is substantially independent of at least one of temperature within a range of operating temperatures of the amplifier, circuit age so long as the circuit is operational, and degradation of a battery supply voltage so long as sufficient battery supply voltage remains to power the amplifier.

22. A method according to claim 1 wherein regulating the control signal comprises regulating using a voltage regulator with use of a known fixed voltage.

23. A method according to claim 22 wherein regulating using a voltage regulator with use of a known fixed voltage comprises receiving at an input of the voltage regulator the known fixed voltage comprising at least one of a known on chip voltage and a bandgap voltage.

24. A system according to claim 8 wherein the regulator is for regulating the control signal with use of a known fixed voltage.

25. A system according to claim 24 wherein the regulator comprises an input for receiving the known fixed voltage comprising at least one of a known on chip voltage and a bandgap voltage.

26. A method for providing amplification of an RF signal comprising:
    providing an RF input signal;
    amplifying with an amplifier the RF input signal to provide an RF output signal;
    measuring an amplitude of the RF output signal to provide an amplitude measurement for determining an applied control voltage for controlling a gain of the amplifier; and,
    adjusting a control signal provided to a variable gain amplifier (VGA) in the amplifier in response to the applied control voltage and one of said amplitude measurement and a supply voltage applied to the amplifier, the VGA for performing the amplifying within the amplifier and exhibiting an upper limit of gain defined by a local maximum of the gain of the VGA as a function of the control signal provided to the VGA, the adjusting of the control signal comprising regulating a voltage of the control signal such that over a finite normal operating range of the gain for the amplifier during use, the first derivative of the gain of the amplifier as a function of the applied control voltage is positive and the gain of the amplifier is constrained between a value at a first endpoint of the range and the upper limit of gain of the VGA at a second other endpoint of the range.

27. A circuit comprising:
    an input port for receiving a variable RF signal for amplification;
    an output port for providing an amplified version of the variable RF signal therefrom;
    a detector for detecting an amplitude of the amplified variable RF signal and for providing a control voltage signal therefrom to the input port of a feedback circuit, the feedback circuit comprising a regulator for regulating a control signal generated with use of the control voltage signal; and
    an amplifier circuit disposed electrically between the input port and the output port for providing gain to the variable RF signal, the amplifier including a control voltage input port for receiving the control voltage signal and a voltage supply port for receiving a supply voltage signal, the amplifier comprising:
    a variable gain amplifier (VGA) for receiving the control signal, the VGA for providing the gain to the variable RF signal and exhibiting an upper limit of gain defined by a local maximum of the gain of the VGA as a function of the control signal provided to the VGA,
    wherein the regulator is for regulating the control signal such that over a finite normal operating range of the gain for the amplifier during use, the first derivative of the gain of the amplifier as a function of the control voltage signal is positive and the gain of the amplifier is constrained between a value at a first endpoint of the range and the upper limit of gain of the VGA at a second other endpoint of the range.

* * * * *